United States Patent
Förster et al.

(10) Patent No.: US 7,548,070 B2
(45) Date of Patent: Jun. 16, 2009

(54) METHOD AND CIRCUIT ARRANGEMENT FOR DETECTING A WIRE BREAK

(75) Inventors: Ralf Förster, Regensburg (DE); Gunther Wolfarth, Regensburg-Harting (DE)

(73) Assignee: Continental Automotive GmbH, Munich (DE)

( * ) Notice: Subject to any disclaimer, the term of this patent is extended or adjusted under 35 U.S.C. 154(b) by 0 days.

(21) Appl. No.: 11/908,853

(22) PCT Filed: Jan. 25, 2006

(86) PCT No.: PCT/EP2006/050426

§ 371 (c)(1),
(2), (4) Date: Sep. 27, 2007

(87) PCT Pub. No.: WO2006/097377

PCT Pub. Date: Sep. 21, 2006

(65) Prior Publication Data

US 2008/0143340 A1  Jun. 19, 2008

(30) Foreign Application Priority Data

Mar. 17, 2005  (DE) .................. 10 2005 012 405

(51) Int. Cl.
*G01R 31/02* (2006.01)
(52) U.S. Cl. .................................................. 324/543
(58) Field of Classification Search ............... 324/543
See application file for complete search history.

(56) References Cited

U.S. PATENT DOCUMENTS

| 5,111,123 | A |   | 5/1992 | Hach et al. |   |
|---|---|---|---|---|---|
| 5,592,097 | A |   | 1/1997 | Shimizu et al. |   |
| 5,684,371 | A | * | 11/1997 | Tarui et al. ............ | 318/400.29 |

FOREIGN PATENT DOCUMENTS

DE   44 03 375 A1   9/1994

* cited by examiner

*Primary Examiner*—Timothy J Dole
(74) *Attorney, Agent, or Firm*—Laurence A. Greenberg; Werner H. Stemer; Ralph E. Locher

(57) ABSTRACT

A method and a circuit are provided for the continuous detection of a line break in a full bridge controlling an inductive load. When the full bridge is switched off or on, a pre-determinable switching device of the circuit is switched first, and then a potential applied to a connection between the switching device and the load is tapped. The tapped potential is then compared with the ground potential when the switching device is connected to the supply potential, or with the supply potential when the switching device is connected to the ground potential. A line break is then determined when the two compared potentials are not different in the free running state thereof.

11 Claims, 2 Drawing Sheets

METHOD AND CIRCUIT ARRANGEMENT FOR DETECTING A WIRE BREAK

BACKGROUND OF THE INVENTION

Field of the Invention

The invention relates to a method and a circuit arrangement for continuously detecting a wire break in a full bridge containing four switching devices operated between a supply potential and a ground potential and controlling a load, a diode being connected in parallel with each switching device.

The technical field of the invention pertains to the detection of a wire break in a full-bridge circuit. Full bridges and H-bridges are known means of driving DC motors in a motor vehicle, e.g. throttle valve, exhaust gas recirculation or the like, in order to enable the DC motor to be operated in a forward direction and a reverse direction, it being important for diagnostic purposes to detect possible wire breaks in the full bridge or H-bridge even during operation of the DC motor.

There are currently two known methods of detecting a wire break in a full bridge. The first method is based on current sensing whereby the current through the full bridge is measured and compared with a reference current. If the measured current is less than the reference current, it is assumed according to the known method that a wire break is present. However, the rate of current rise in the actuator or motor is dependent on its electrical characteristics. Therefore, wire breaks may be erroneously detected if the on-times are set too short. This can be avoided by suitably selecting the filter time. However, this involves much time and effort in adapting the filter time to the relevant actuator, i.e. for each actuator used, this filter time must first be determined and then set for the actuator. The adaptation to the relevant actuator requires time and testing, resulting in additional costs for wire break detection.

The second method is based on voltage measurement. For this purpose suitable diagnostic devices are provided at the outputs of the full bridge. The disadvantage of this second method is that it must be ensured that the full bridge is in the off state during the diagnostics phase. Consequently, with this second method, continuous wire break detection, i.e. diagnostics during actuator operation, is not possible. In addition, with the second method the voltage measurement for wire break detection must be initiated, i.e. induced. This requires yet more expenditure of time compared to the first method.

SUMMARY OF THE INVENTION

The object of the present invention is therefore to perform continuous wire break detection on a full bridge, said wire break detection being designed to be independent of the current flowing through the inductive load.

This object is achieved according to the invention by a method having the features set forth in claim 1 and by a circuit arrangement having the features set forth in claim 2.

According to the invention, continuous wire break detection during connected operation of the inductive load or inductive actuator is advantageously possible. The inventive method and the inventive circuit arrangement do not need to be adapted to the load to be driven or to the respective actuator. In addition, potential measurement for detection purposes does not need to be specially initiated. This means that the invention allows simple and therefore inexpensive detection of wire breaks in full bridges.

Advantageous embodiments and developments of the invention will emerge from the dependent claims and the description which proceeds with reference to the accompanying drawings.

According to a preferred development of the invention, a diode is connected in parallel with a load junction of each switching device. This diode ensures that potential differences can also be measured during switching of the circuit arrangement, i.e. during operation of the load.

According to a preferred embodiment of the invention, the control circuit generates a control signal for each of the switching devices with which the switching devices can be switched over, the control circuit transmitting precisely one of the four control signals prior to the other control signals for connection to a predeterminable switching device. Depending on the required direction and the control clock, the control circuit advantageously generates a drive which prevents shunt currents during switching between the operating directions and between turn-on and freewheeling. Freewheeling can be effected actively via a switch activated in the freewheeling path or passively via a parallel connected diode.

According to another preferred embodiment, the comparison device has:

a) a first comparator which compares a first potential, which is present at a connection between the first switching device and the load, with the supply potential and provides a positive logical signal level on the output side if the two compared potentials are different in the freewheeling state;

b) a second comparator which compares a second potential of a connection between the second switching device and the load with the supply potential and provides a positive logical signal level on the output side if the two compared potentials are different in the freewheeling state;

c) a third comparator which compares a third potential of a connection between the third switching device and the load with the ground potential and provides a positive logical signal level on the output side if the two compared potentials are different in the freewheeling state; and d) a fourth comparator which compares a fourth potential of a connection between the fourth switching device and the load with the ground potential and provides a positive logical signal level on the output side if the two compared potentials are different in the freewheeling state.

According to another preferred embodiment, the evaluator evaluates the signal levels provided on the output side by the comparators and detects a wire break if no comparator delivers a positive signal level in the freewheeling state, the evaluator circuit advantageously assessing whether the drive was sufficient to produce freewheeling.

According to another preferred embodiment, at least one switching device is implemented as a MOSFET, in particular as a power MOSFET. Due to the fact that MOSFET technology already incorporates a freewheeling diode, by using a MOSFET it is advantageously unnecessary to specially provide a diode connected in parallel with the switching device.

According to another preferred embodiment, the four switching devices are implemented as a bipolar transistor in each case and the relevant diode as an external diode connected in parallel with the bipolar transistor.

According to another preferred embodiment, the four switching devices are implemented as a Darlington transistor in each case and the relevant diode as an external diode connected in parallel with the Darlington transistor.

According to another preferred embodiment, at least one switching device is implemented as an IGBT (Insulated Gate Bipolar Transistor) and the relevant diode as an external diode connected in parallel with the relevant IGBT.

The invention will now be explained in greater detail with reference to the exemplary embodiments illustrated in the accompanying drawings, in which:

DESCRIPTION OF THE INVENTION

In all the figures—unless specified otherwise—the same or functionally identical elements and signals have been provided with the same reference symbols.

Figure 1:
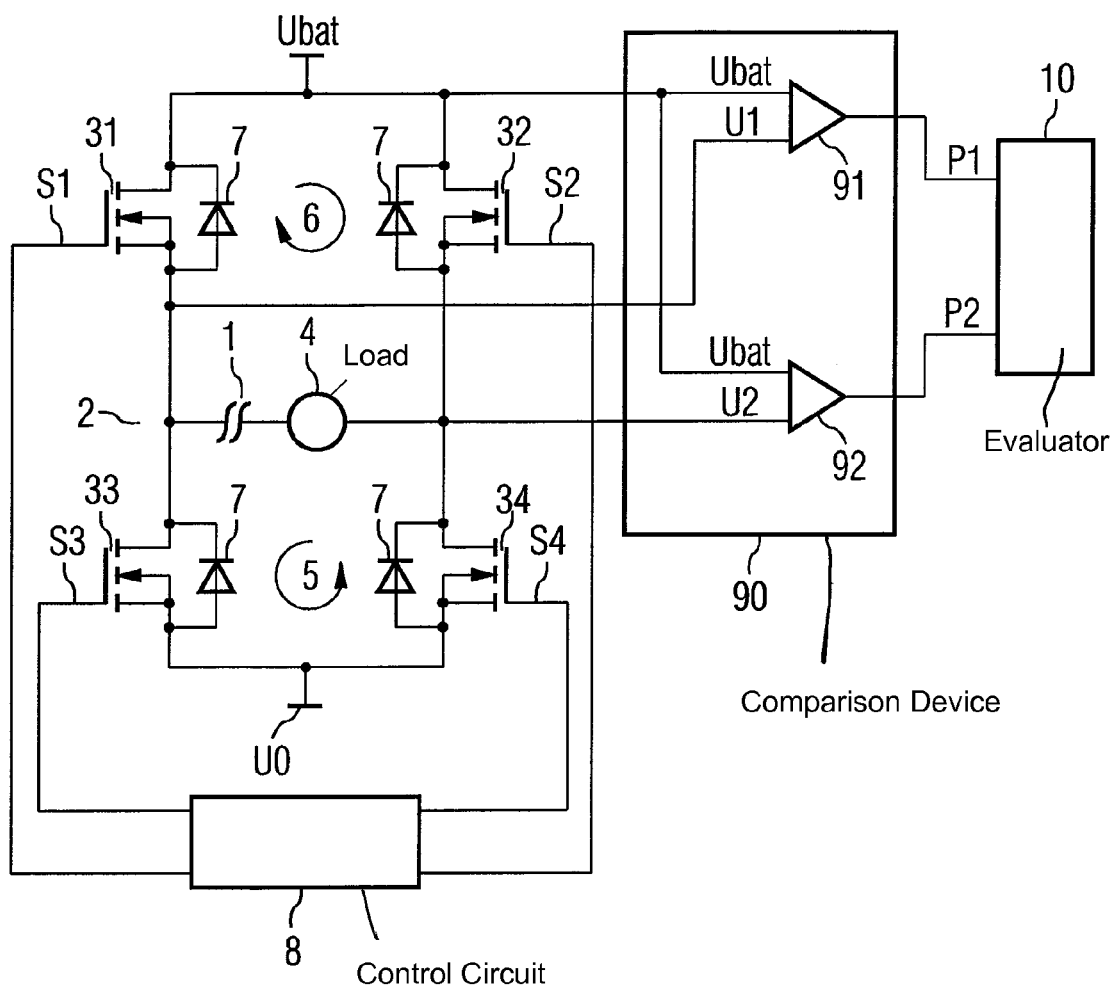
FIG. 1 shows a schematic block diagram of a preferred exemplary embodiment of an inventive circuit arrangement for continuously detecting a wire break in a full bridge during freewheeling to supply potential.
Figure 2:
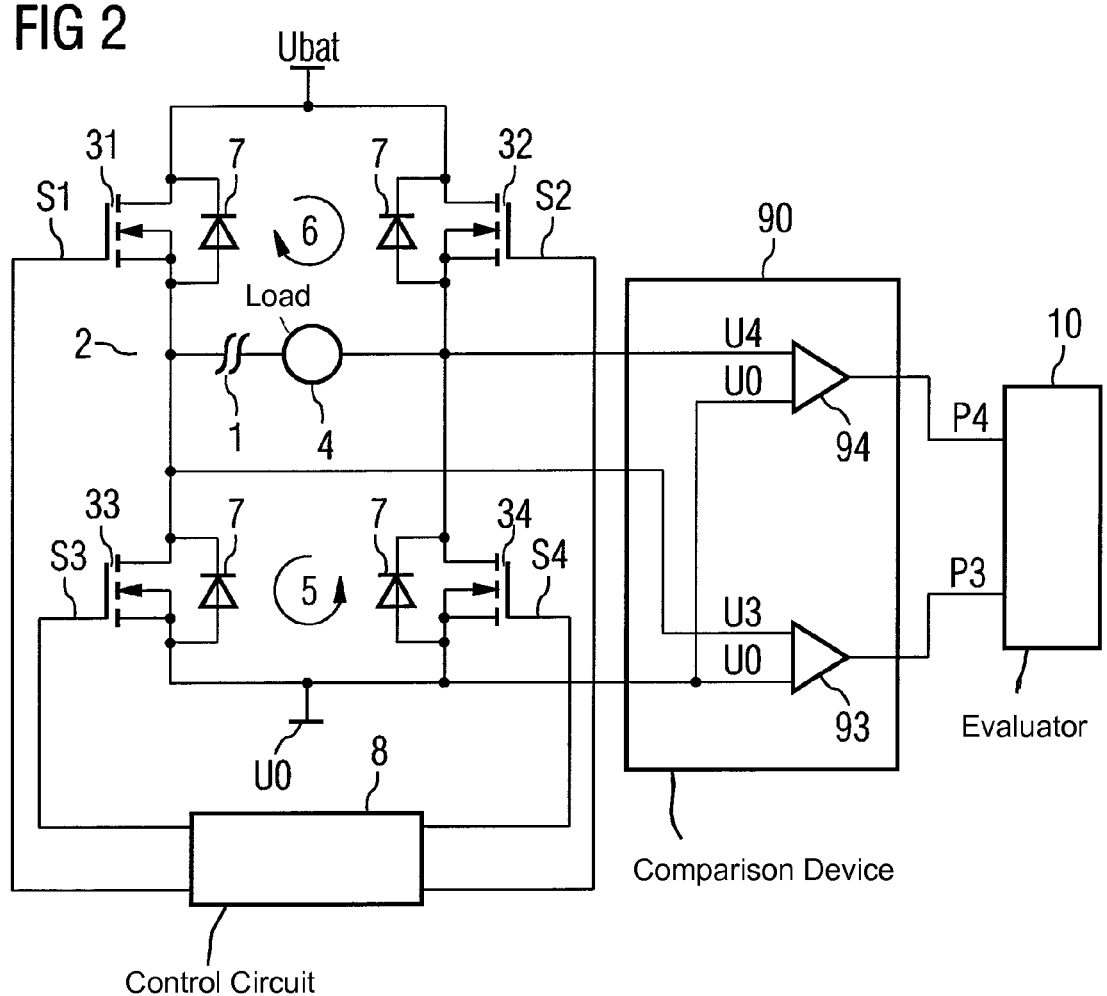
FIG. 2 shows a schematic block diagram of the preferred exemplary embodiment of the inventive circuit arrangement for continuously detecting a wire break in a full bridge during freewheeling to ground potential according to FIG. 1.

For the sake of clarity, FIGS. 1 and 2 are provided to illustrate the circuit arrangement according to the invention. FIG. 1 shows the comparators 91 and 92 of a comparison device 90 which detect freewheeling voltages during freewheeling of the load 4 to the supply potential 6 and transmit the detected signal levels P1, P2 to an evaluator 10. Conversely, FIG. 2 shows the comparators 93 and 94 of the comparison device 90 which detect freewheeling voltages 5 during freewheeling of the load 4 to ground potential $U_0$ and transmit the detected signal levels P3, P4 to the evaluator 10.

FIG. 1 therefore shows a schematic block diagram of a preferred embodiment of a circuit arrangement for continuously detecting a wire break 1 in a full bridge 2 during freewheeling to the supply potential $V_{bat}$.

The circuit arrangement contains a full bridge 2. The full bridge 2 consists of four switching devices 31-34 operated between a supply potential Ubat and a ground potential U0. Each switching device 31-34 has a parallel-connected diode 7. The full bridge 2 is used to drive an inductive load 4.

The circuit arrangement according to the invention also has a control circuit 8 which generates control signals S1-S4 for controlling the switching devices 31-34 respectively and with which the switching devices 31-34 can be switched. For example, the control circuit 8 controls the first switching device 31 by means of the first control signal S1. In addition, the control circuit 8 transmits precisely one of the four control signals S1-S4 with a short time delay for switching to a predeterminable switching device 31-34 so that shunt currents are avoided.

The circuit arrangement according to the invention also has a first comparator 91 which compares a first potential U1 of the connection of the first switching device 31 and the load 4 with the supply potential Ubat and provides a positive logical signal level P1 on the output side if the first potential U1 is greater than the supply potential Ubat (U1>Ubat) in the freewheeling state. If U1=Ubat, the first comparator 91 supplies a negative logical signal level. The same applies analogously to the comparator 92 for U2=Ubat.

The circuit arrangement according to the invention also has a second comparator 92 which compares a second potential U2 of the second switching device 32 and the load 4 with the supply potential Ubat and provides a positive logical signal level P2 on the output side if the second potential U2 is greater than the supply potential Ubat (U2>Ubat).

In addition, the circuit arrangement according to the invention has an evaluator 10 which evaluates the signal levels P1,P2 supplied by the comparators 91,92 on the output side, detecting a wire break 1 if no positive signal pulse P1 or P2 occurs within a control cycle.

FIG. 2 shows a schematic block diagram of the preferred embodiment of the inventive circuit arrangement for continuously detecting the wire break 1 in the full bridge during freewheeling 5 to ground potential $U_0$.

In order to be able to detect a wire break during freewheeling 5 to ground potential $U_0$, the comparison device 90 of the circuit arrangement according to the invention contains the comparators 93 and 94. The third and fourth comparator 93, 94 are connected on the output side to the evaluator 10 in exactly the same way as the first comparator 91 and the second comparator 92.

The third comparator 93 compares a third potential U3 of the connection of the third switching device 33 and the load 4 with the ground potential U0 and supplies a positive logical signal level P3 on the output side if the third potential U3 is less than the ground potential U0 (U3<U0). If U3=U0, the third comparator 93 supplies a negative logical signal level. The same applies analogously to the comparator 94 for U4=U0.

The fourth comparator 94 compares a fourth potential U4 of the connection of the fourth switching device 34 and the load 4 with the ground potential U0 and supplies a positive logical signal level P4 on the output side if the fourth potential U4 is less than the ground potential U0 (U4<U0).

Figure 3:
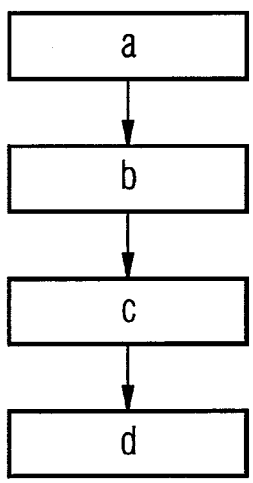
FIG. 3 shows a schematic flowchart of a preferred exemplary embodiment of the inventive method for continuously detecting a wire break in a full bridge.

FIG. 3 shows a schematic flowchart of a preferred embodiment of the inventive method for continuously detecting a wire break 1 in a full bridge 2, said method being executable by means of the circuit arrangement according to FIGS. 1 and 2.

The inventive method for continuously detecting a wire break 1 is carried out during operation of the load 4 with a control clock.

Step a:
Deactivating or switching over the full bridge 2, a predeterminable switching device 31-34 being switched first.

Step b:
Tapping off a potential U1-U4 present at a connection between the switching device 31-34 switched first and the load 4.

Step c:
Comparing the tapped-off potential U1-U4 with the supply potential Ubat, if the switching device 31-34 switched first is connected to the ground potential U0, or with the ground potential U0 if the switching device 31-34 switched first is connected to the supply potential (6).

Step d:
Detecting a line break 1 if the two compared potentials U1-U4, U0, Ubat are not different in the freewheeling state.

Although the present invention has been described above on the basis of the preferred exemplary embodiments, it is not limited thereto but can be modified in a variety of ways. For example, it is also conceivable for transistors other than those specified above to be used as switching devices. In addition, is also possible to replace the comparators used by other devices such as microprocessors which compare the relevant potentials and, in the case of a positive comparison, supply a positive signal level. Moreover, it is also possible to reverse the signal level logic. By reversing the conductivity types of the switching devices (n for p) and vice versa, any number of other circuit variants can be obtained without deviating from the main inventive idea.

It should be noted that the wire break 1 shown in FIGS. 1 and 2 is shown at this particular location only by way of example. According to the invention, any wire breaks 1 can be detected at any points in the circuit and assigned via suitable evaluation.

The four switching devices 31-34 shown in FIGS. 1 and 2 are implemented here as power MOSFETs and the respective diode 7 as a parasitic diode of the respective MOSFET.

However, the four switching devices 31-34 according to FIGS. 1 and 2 can also be implemented by any other switching devices, e.g. as bipolar transistors, as Darlington transistors or as IGBTs.

The invention claimed is:

1. A method for continuously detecting a wire break in a full bridge driving an inductive load, the full bridge containing four switching devices operated between a supply potential and a ground potential, which comprises the steps of:
   performing one of deactivating the full bridge and switching over the full bridge by switching one predetermined switching device of the switching devices first;
   tapping off a potential present at a connection between the predetermined switching device switched first and the inductive load resulting in a tapped-off potential;
   comparing the tapped-off potential with the supply potential if the predetermined switching device switched first is connected to the ground potential, or with the ground potential if the predetermined switching device switched first is connected to the supply potential; and
   detecting a wire break if compared potentials are not different in a freewheeling state.

2. A circuit configuration for continuously detecting a wire break in a full bridge driving an inductive load, the full bridge containing four switching devices operated between a supply potential and a ground potential, the circuit configuration comprising:
   a control circuit for one of switching over and deactivating the full bridge, said control circuit switching a predetermined switching device of the switching devices first;
   a comparison device for comparing a potential present at a connection between the predetermined switching device switched first and the inductive load with the supply potential if the predetermined switching device switched first is connected to the ground potential, or with the ground potential if the predetermined switching device switched first is connected to the supply potential, said comparison device providing a signal level on an output side being a positive signal level if compared potentials are different in a freewheeling state; and
   an evaluator having an input side connected to said output side of said comparison device and receiving the signal level on said input side, said evaluator determining a presence of the wire break if the signal level is not positive in the freewheeling state.

3. The circuit configuration according to claim 2, further comprising a diode connected in parallel with a load junction of each of the switching devices.

4. The circuit configuration according to claim 2, wherein said control circuit generates control signals for the switching devices and the control signals can cause a switching over of the switching devices, said control circuit transmitting precisely one of four control signals prior to other control signals for switching over the predetermined switching device.

5. The circuit configuration according to claim 2, wherein at least one of the switching devices is a MOSFET.

6. The circuit configuration according to claim 2, wherein at least one of the switching devices is a bipolar transistor with a freewheeling diode.

7. The circuit configuration according to claim 2, wherein at least one of the switching devices is a Darlington transistor with a freewheeling diode.

8. The circuit configuration according to claim 2, wherein at least one of the switching devices is an IGBT with a freewheeling diode.

9. The circuit configuration according to claim 2, wherein at least one of the switching devices is a power MOSFET.

10. A circuit configuration for continuously detecting a wire break in a full bridge driving an inductive load, the full bridge containing four switching devices operated between a supply potential and a ground potential, the circuit configuration comprising:
    a control circuit for one of switching over and deactivating the full bridge, said control circuit switching a predetermined switching device of the switching devices first;
    a comparison device for comparing a potential present at a connection between the predetermined switching device switched first and the inductive load with the supply potential if the predetermined switching device switched first is connected to the ground potential, or with the ground potential if the predetermined switching device switched first is connected to the supply potential, said comparison device providing a signal level on an output side being a positive signal level if compared potentials are different in a freewheeling state; and
    an evaluator having an input side connected to said output side of said comparison device and receiving the signal level on said input side, said evaluator determining a presence of the wire break if the signal level is not positive in the freewheeling state;
    said comparison device including:
        a first comparator for comparing a first potential present at a connection between a first switching device of the switching devices and the inductive load with the supply potential and provides a positive logical signal level on an output side if compared potentials are different in the freewheeling state;
        a second comparator comparing a second potential present at a connection between a second switching device of the switching devices and the inductive load with the supply potential and provides a positive logical signal level on an output side if compared potentials are different in the freewheeling state;
        a third comparator compares a third potential present at a connection between a third switching device of the switching devices and the inductive load with the ground potential and provides a positive logical signal level on an output side if compared potentials are different in the freewheeling state; and
        a fourth comparator comparing a fourth potential present at a connection between a fourth switching device of the switching devices and the inductive load with the ground potential and provides a positive logical signal level on an output side if compared potentials are different in the freewheeling state.

11. The circuit configuration according to claim 10, wherein said evaluator evaluates signal levels provided by said comparators on said output side, and detects the wire break if none of said comparators delivers the positive logic signal level in the freewheeling state.

\* \* \* \* \*